(12) United States Patent
Nishii et al.

(10) Patent No.: US 7,982,857 B2
(45) Date of Patent: Jul. 19, 2011

(54) STAGE APPARATUS, EXPOSURE APPARATUS, AND EXPOSURE METHOD WITH RECOVERY DEVICE HAVING LYOPHILIC PORTION

(75) Inventors: Yasufumi Nishii, Kumagaya (JP); Kenichi Shiraishi, Saitama (JP); Hirotaka Kohno, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/582,268

(22) PCT Filed: Dec. 15, 2004

(86) PCT No.: PCT/JP2004/018702
§ 371 (c)(1),
(2), (4) Date: Jun. 9, 2006

(87) PCT Pub. No.: WO2005/057636
PCT Pub. Date: Jun. 23, 2005

(65) Prior Publication Data
US 2007/0109521 A1    May 17, 2007

(30) Foreign Application Priority Data
Dec. 15, 2003    (JP) ................................. 2003-416712

(51) Int. Cl.
*G03B 27/58* (2006.01)
(52) U.S. Cl. ........................................................ 355/72
(58) Field of Classification Search ................... 355/72, 355/73, 53, 67; 356/665
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 4,509,852 A * | 4/1985 | Tabarelli et al. | ................ 355/30 |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,825,043 A | 10/1998 | Suwa | |
| 5,874,820 A | 2/1999 | Lee | |
| 6,032,997 A | 3/2000 | Elliott et al. | |

(Continued)

FOREIGN PATENT DOCUMENTS

DE    221 563 A1    4/1985

(Continued)

OTHER PUBLICATIONS

Lin, B.J. "Semiconductor Foundry, Lithography, and Partners." Proceedings of SPIE, vol. 4688, pp. 11-24, 2002.

(Continued)

*Primary Examiner* — Peter B Kim
*Assistant Examiner* — Chia-how Michael Liu
(74) *Attorney, Agent, or Firm* — Oliff & Berridge, PLC

(57) ABSTRACT

A stage apparatus PST is provided with a holder PH, which has a substrate holding surface 33A that holds a substrate P; a stage 52, which supports and moves the holder PH; and a recovery apparatus 60, which is disposed in the vicinity of the holder PH and has lyophilic parts 3, 5 of which at least a part of each is lyophilic, that uses the lyophilic parts 3, 5 to recover a liquid 1. As a result, the infiltration of liquid into the space between the substrate and the holder is prevented, even if performing an exposure treatment by filling the space between a projection optical system and the substrate with the liquid.

23 Claims, 9 Drawing Sheets

U.S. PATENT DOCUMENTS

| | | | |
|---|---|---|---|
| 6,255,796 B1 | 7/2001 | Ebihara et al. | |
| 6,988,327 B2 * | 1/2006 | Garcia et al. | 34/407 |
| 2001/0035897 A1 * | 11/2001 | Hayashi et al. | 347/65 |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0002004 A1 | 1/2005 | Kolesnychenko et al. | |
| 2005/0007569 A1 | 1/2005 | Streefkerk et al. | |
| 2005/0007570 A1 | 1/2005 | Streefkerk et al. | |
| 2005/0018155 A1 | 1/2005 | Cox et al. | |
| 2005/0018156 A1 | 1/2005 | Mulkens et al. | |
| 2005/0024609 A1 | 2/2005 | De Smit et al. | |
| 2005/0030497 A1 | 2/2005 | Nakamura | |
| 2005/0030498 A1 | 2/2005 | Mulkens | |
| 2005/0030506 A1 | 2/2005 | Schuster | |
| 2005/0030511 A1 | 2/2005 | Auer-Jongepier et al. | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0041225 A1 | 2/2005 | Sengers et al. | |
| 2005/0042554 A1 | 2/2005 | Dierichs et al. | |
| 2005/0046813 A1 | 3/2005 | Streefkerk et al. | |
| 2005/0046934 A1 | 3/2005 | Ho et al. | |
| 2005/0048220 A1 | 3/2005 | Mertens et al. | |
| 2005/0048223 A1 | 3/2005 | Pawloski et al. | |
| 2005/0052632 A1 | 3/2005 | Miyajima | |
| 2005/0068639 A1 | 3/2005 | Pierrat et al. | |
| 2005/0073670 A1 | 4/2005 | Carroll | |
| 2005/0074704 A1 | 4/2005 | Endo et al. | |
| 2005/0078286 A1 | 4/2005 | Dierichs et al. | |
| 2005/0078287 A1 | 4/2005 | Sengers et al. | |
| 2005/0084794 A1 | 4/2005 | Meagley et al. | |
| 2005/0088635 A1 | 4/2005 | Hoogendam et al. | |
| 2005/0094114 A1 | 5/2005 | Streefkerk et al. | |
| 2005/0094116 A1 | 5/2005 | Flagello et al. | |
| 2005/0094119 A1 | 5/2005 | Loopstra et al. | |
| 2005/0100745 A1 | 5/2005 | Lin et al. | |
| 2005/0106512 A1 | 5/2005 | Endo et al. | |
| 2005/0110973 A1 | 5/2005 | Streefkerk et al. | |
| 2005/0117135 A1 | 6/2005 | Verhoeven et al. | |
| 2005/0117224 A1 | 6/2005 | Shafer et al. | |
| 2005/0122497 A1 | 6/2005 | Lyons et al. | |
| 2005/0122505 A1 | 6/2005 | Miyajima | |
| 2005/0128445 A1 | 6/2005 | Hoogendam et al. | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0136361 A1 | 6/2005 | Endo et al. | |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146693 A1 | 7/2005 | Ohsaki | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0174550 A1 | 8/2005 | Streefkerk et al. | |
| 2005/0175776 A1 | 8/2005 | Streefkerk et al. | |
| 2005/0175940 A1 | 8/2005 | Dierichs | |
| 2005/0179877 A1 | 8/2005 | Mulkens et al. | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219488 A1 | 10/2005 | Nei et al. | |
| 2005/0219499 A1 | 10/2005 | Zaal et al. | |
| 2005/0225737 A1 | 10/2005 | Weissenrieder et al. | |
| 2005/0231694 A1 | 10/2005 | Kolesnychenko et al. | |
| 2005/0233081 A1 | 10/2005 | Tokita | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0259234 A1 | 11/2005 | Hirukawa et al. | |
| 2005/0259236 A1 | 11/2005 | Straaijer | |
| 2005/0263068 A1 | 12/2005 | Hoogendam et al. | |
| 2005/0264778 A1 | 12/2005 | Lof et al. | |
| 2005/0270505 A1 | 12/2005 | Smith | |
| 2006/0023181 A1 | 2/2006 | Novak | |
| 2006/0103832 A1 | 5/2006 | Hazelton et al. | |
| 2006/0139614 A1 | 6/2006 | Owa et al. | |

FOREIGN PATENT DOCUMENTS

| | | |
|---|---|---|
| DE | 224 448 A1 | 7/1985 |
| EP | 0 605 103 A1 | 7/1994 |
| EP | 1 429 188 A2 | 6/2004 |
| JP | A 57-153433 | 9/1982 |
| JP | A 58-202448 | 11/1983 |
| JP | A 59-019912 | 2/1984 |
| JP | A 62-065326 | 3/1987 |
| JP | A 63-157419 | 6/1988 |
| JP | A 04-305915 | 10/1992 |
| JP | A 04-305917 | 10/1992 |
| JP | A 05-062877 | 3/1993 |
| JP | A 06-124873 | 5/1994 |
| JP | A 6-168866 | 6/1994 |
| JP | A 07-220990 | 8/1995 |
| JP | A 8-63231 | 3/1996 |
| JP | A 8-166475 | 6/1996 |
| JP | A 08-316125 | 11/1996 |
| JP | A 8-330224 | 12/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-176727 | 7/1999 |
| JP | A 2000-058436 | 2/2000 |
| JP | A 2000-505958 | 5/2000 |
| JP | A 2004-289127 | 10/2004 |
| JP | A-2005-19864 | 1/2005 |
| WO | WO 99/49504 | 9/1999 |
| WO | WO 99/49504 A1 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |

| | | | |
|---|---|---|---|
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/048328 A1 | 5/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/062351 A1 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Switkes, M., et al. "Resolution Enhancement of 157nm Lithography by Liquid Immersion." Proceedings of SPIE, vol. 4691, pp. 459-465, 2002.

Switkes, M., et al. "Resolution Enhancement of 157nm Lithography by Liquid Immersion." J. Microlith., Microfab., Microsyst., vol. 1, No. 3, pp. 1-4, 2002.

Owa, Soichi, et al. "Nikon F2 Exposure Tool," slides 1-25, $3^{rd}$ 157nm Symposium, Sep. 4, 2002.

Owa, Soichi. "Immersion Lithography," slides 1-24, Immersion Lithography Workshop, Dec. 11, 2002.

Owa, Soichi, et al. "Immersion Lithography; its Potential Performance and Issues." Proceedings of SPIE, vol. 5040, pp. 724-733, 2003.

Owa, Soichi, et al. "Potential Performance and Feasibility of Immersion Lithography," slides 1-33, NGL Workshop 2003, Jul. 10, 2003.

Owa, Soichi, et al. "Update on 193nm Immersion Exposure Tool," slides 1-38, Immersion Workshop 2004, Jan. 27, 2004.

Owa, Soichi, et al. "Update on 193nm Immersion Exposure Tool," slides 1-51, Litho Forum, Jan. 28, 2004.

Jul. 31, 2008 Supplementary European Search Report in European Application No. 04807061.9.

Oct. 13, 2009 Office Action in European Application No. 04807061.9.

Jun. 24, 2010 Notice of Allowance in European Application No. 04807061.9.

Apr. 4, 2008 Office Action in Chinese Application No. 200480037202.8, with translation.

Sep. 12, 2008 Office Action in Chinese Application No. 200480037202.8, with translation.

Jan. 9, 2009 Notice of Allowance in Chinese Application No. 200480037202.8, with translation.

Apr. 12, 2005 International Search Report in Application No. PCT/JP2004/018702, with translation.

Apr. 12, 2005 Written Opinion in Application No. PCT/JP2004/018702, with translation.

Dec. 1, 2009 Office Action in Japanese Application No. 2005-516240, with translation.

Dec. 7, 2010 Japanese Office Action in Japanese Application No. 2005-516240, with translation.

May 2, 2011 Office Action in Korean Application No. 2006-7008543, with translation.

* cited by examiner

STAGE APPARATUS, EXPOSURE APPARATUS, AND EXPOSURE METHOD WITH RECOVERY DEVICE HAVING LYOPHILIC PORTION

BACKGROUND OF THE INVENTION

1. Field of the Invention

The present invention relates to a stage apparatus having a holder that holds a substrate as well as a stage that supports and moves the holder, an exposure apparatus comprising the stage apparatus, and an exposure method; more particularly, the present invention relates to a stage apparatus, an exposure apparatus, and an exposure method suited for use when exposing a substrate with an image of a pattern through a projection optical system and a liquid. In addition, the disclosure of the following priority application is hereby incorporated by reference in its entirety: Japanese Patent Application No. 2003-416712, filed on Dec. 15, 2003.

2. Description of the Related Art

Semiconductor devices and liquid crystal display devices are fabricated by a so-called photolithography technique, wherein a pattern formed on a mask is transferred onto a photosensitive substrate.

An exposure apparatus used in this photolithographic process comprises a mask stage that supports the mask, as well as a substrate stage that supports the substrate, and transfers the pattern of the mask onto the substrate through a projection optical system while successively moving the mask stage and the substrate stage.

There has been demand in recent years for higher resolution projection optical systems in order to handle the much higher levels of integration of device patterns. The shorter the exposure wavelength used and the larger the numerical aperture of the projection optical system, the higher the resolution of the projection optical system becomes. Consequently, the exposure wavelength used in exposure apparatuses has shortened year by year, and the numerical aperture of projection optical systems has increased. Furthermore, the mainstream exposure wavelength currently is the 248 nm KrF excimer laser, but an even shorter wavelength 193 nm ArF excimer laser is also being commercialized. In addition, as with resolution, the depth of focus (DOF) is important when performing an exposure. The following equations express the resolution R and the depth of focus δ, respectively.

$$R = k_1 \cdot \lambda / NA \quad (1)$$

$$\delta = \pm k_2 \cdot \lambda / NA^2 \quad (2)$$

Therein, $\lambda$ is the exposure wavelength, NA is the numerical aperture of the projection optical system, and $k_1$ and $k_2$ are the process coefficients. Equations (1) and (2) teach that if the exposure wavelength $\lambda$ is shortened and the numerical aperture NA is increased in order to enhance the resolution R, then the depth of focus δ narrows.

At this time, if the depth of focus δ becomes excessively narrow, then it will become difficult to align the front surface of the substrate with the image plane of the projection optical system, and there will be a risk of insufficient margin during the exposure operation.

Accordingly, a liquid immersion method has been proposed, as disclosed in, for example, Patent Document 1 below, as a method to substantially shorten the exposure wavelength and increase the depth of focus. This liquid immersion method forms an immersion area by filling a liquid, such as water or an organic solvent, between the lower surface of the projection optical system and the front surface of the substrate, thus taking advantage of the fact that the wavelength of the exposure light in a liquid is 1/n of that in the air (where n is the refractive index of the liquid, normally about 1.2-1.6), thereby improving the resolution as well as increasing the depth of focus by approximately n times.

Nevertheless, the related art discussed above has the following types of problems.

The abovementioned related art is constituted so that the liquid locally fills the space between the substrate (wafer) and the end surface on the image plane side of the projection optical system, and so that the liquid does not flow out to the outer side of the substrate when exposing a shot region in the vicinity of the center of the substrate. Nevertheless, if an attempt is made to set the projection area 100 of the projection optical system to a peripheral area (edge area) E of a substrate P and then expose the edge area E of the substrate P, as depicted by the schematic diagram of FIG. 10, there is a problem in that the liquid flows out to the outer side of the substrate P, and therefore the immersion area does not form satisfactorily, which degrades the projected pattern image. In addition, the liquid that flows out can also cause problems such as rusting of mechanical parts and the like around the substrate stage that supports the substrate P, as well as electrical leakage of the stage drive system and the like.

Furthermore, if the liquid that flows out to the outer side of the substrate P travels around to the rear surface of the substrate P and infiltrates the space between the substrate P and the substrate stage (substrate holder), then it will also cause a problem wherein the substrate stage cannot satisfactorily hold the substrate P. In addition, if the liquid infiltrates the step or the gap between the substrate P and the substrate stage, then in this case as well there is a possibility that the liquid will cause rust or electric leakage. Particularly if a positioning notched part, such as a notched part and an orientation flat part (orientation flat), is formed in the substrate P, then the gap between the outer circumference of the substrate P and the table part at the periphery thereof will increase, which will consequently make it easy for the liquid to travel around through this gap.

The present invention was made considering the abovementioned problems, and it is an object of the present invention to provide a stage apparatus, an exposure apparatus, and an exposure method that can prevent the infiltration of a liquid into the space between a substrate and a holder, and that can perform exposure in a state wherein an immersion area is satisfactorily formed, even when exposing an edge area of the substrate.

SUMMARY OF THE INVENTION

To achieve the abovementioned objects, the present invention adopts the following constitution, corresponding to FIG. 1 through FIG. 9 that depict the embodiments of the present invention.

The stage apparatus of the present invention comprises a holder, which has a substrate holding surface that holds a substrate, and a stage, which supports and moves the holder, comprising: a recovery apparatus, which is disposed in the vicinity of the holder, that has a lyophilic part, of which at least a part is lyophilic, and that recovers a liquid using the lyophilic part.

Accordingly, because the lyophilic parts of the stage apparatus of the present invention have an affinity for the liquid, it is possible to guide the liquid that infiltrates the vicinity of the holder in a direction away from the substrate holding surface, and then recover the liquid. Consequently, it is possible to prevent the infiltration of the liquid between the substrate holding surface and the rear surface of the substrate, and thereby to expose the edge area of the substrate in a state wherein the immersion area is satisfactorily formed.

In addition, an exposure apparatus of the present invention comprises a stage apparatus as described in the claims. Furthermore, an exposure method of the present invention is to transfer a mask pattern through a projection optical system onto a substrate on a holder while filling the liquid between the projection optical system and the substrate and performing an exposure while preventing the infiltration of the liquid into the space between the substrate holding surface and the rear surface of the substrate.

With the exposure apparatus and the exposure method of the present invention, it is possible to prevent the infiltration of the liquid into the space between the substrate holding surface and the rear surface of the substrate, even when filling the liquid between the projection optical system and the substrate and exposing the edge area of the substrate. Accordingly, it is possible to perform an exposure while satisfactorily holding the substrate.

With the present invention, the liquid can be prevented from traveling around to the space between the substrate and the holder, even when exposing the edge area of the substrate, and it is thereby possible to perform an immersion exposure while satisfactorily holding the liquid below the projection optical system.

DETAILED DESCRIPTION OF THE INVENTION

Figure 1:
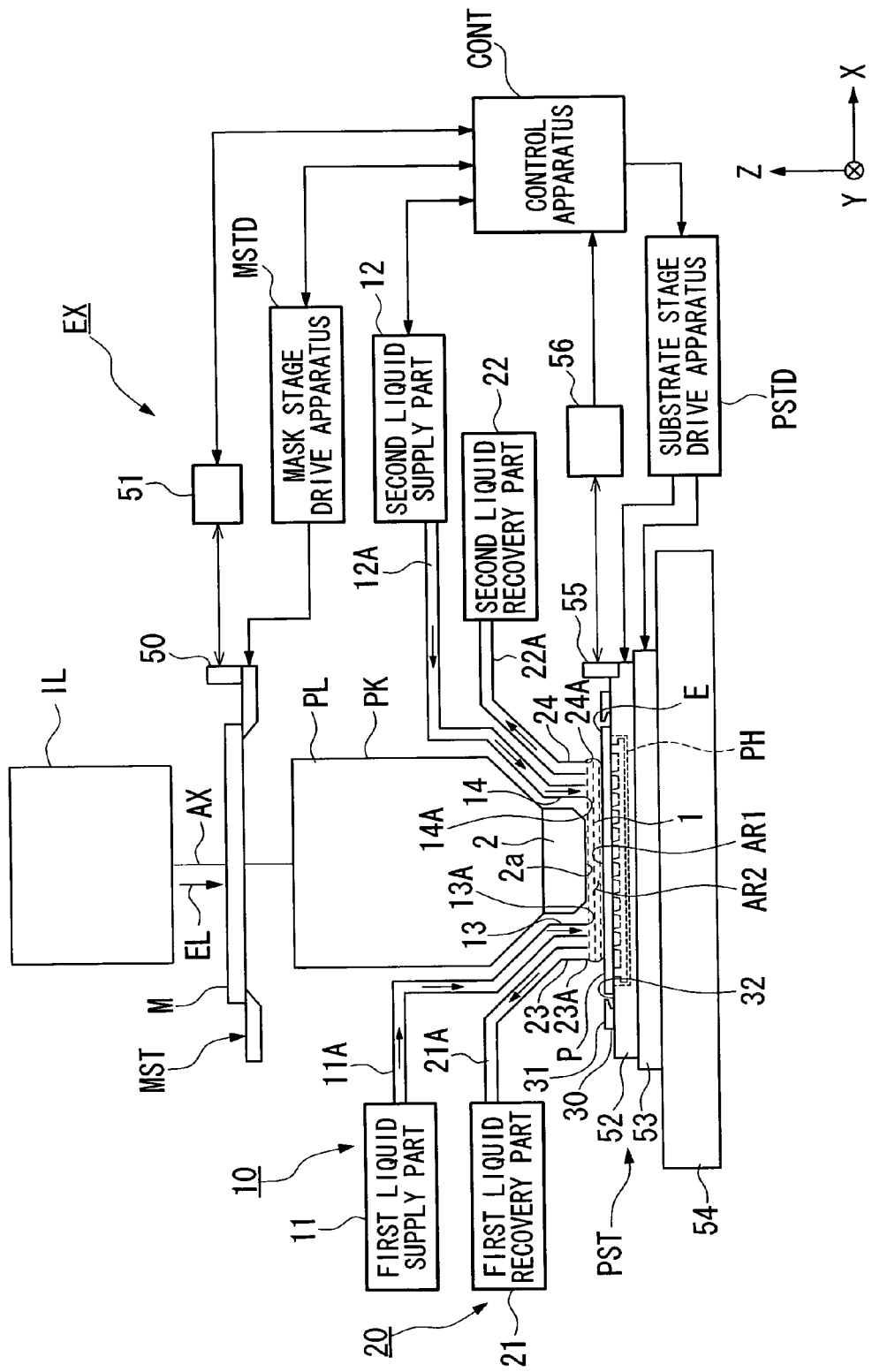
FIG. 1 is a schematic block diagram that depicts one embodiment of an exposure apparatus according to the present invention.

The following explains the embodiments of the stage apparatus and the exposure apparatus of the present invention, referencing FIG. 1 through FIG. 9. FIG. 1 is a schematic block diagram that depicts one embodiment of the exposure apparatus according to the present invention.

First Embodiment

In FIG. 1, an exposure apparatus EX comprises: a mask stage MST that supports a mask M; a substrate stage PST that supports a substrate P; an illumination optical system IL that illuminates the mask M, which is supported by the mask stage MST, with an exposure light EL; a projection optical system PL that projects and exposes a pattern image of the mask M illuminated by the exposure light EL onto the substrate P supported by the substrate stage PST, which functions as the stage apparatus; and a control apparatus CONT that provides overall control of the operation of the entire exposure apparatus EX.

The exposure apparatus EX of the present embodiment is a liquid immersion type exposure apparatus that applies the liquid immersion method to substantially shorten the exposure wavelength, improve the resolution, as well as substantially increase the depth of focus, and comprises a liquid supply mechanism 10 that supplies a liquid 1 between the projection optical system PL and the substrate P, and a liquid recovery mechanism 20 that recovers the liquid 1 on the substrate P. In the present embodiment, pure water is used as the liquid 1. At least during the transfer of the pattern image of the mask M onto the substrate P, the exposure apparatus EX forms an immersion area AR2 with the liquid 1, which is supplied by the liquid supply mechanism 10, in at least one part on the substrate P that includes a projection area AR1 of the projection optical system PL. Specifically, the exposure apparatus EX exposes the substrate P by filling the liquid 1 between an optical element 2 at the tip part of the projection optical system PL and the front surface (exposure surface) PA (refer to FIG. 4) of the substrate P, and then projecting the pattern image of the mask M onto the substrate P through the projection optical system PL and the liquid 1 which is provided between this projection optical system PL and the substrate P.

The present embodiment will now be explained as exemplified by a case of using a scanning type exposure apparatus (a so-called scanning stepper) as the exposure apparatus EX that exposes the substrate P with the pattern formed on the mask M while synchronously moving the mask M and the substrate P in their respective scanning directions in mutually different orientations (reverse directions). In the following explanations, the direction that coincides with an optical axis AX of the projection optical system PL is the Z axial direction, the direction in which the mask M and the substrate P synchronously move (in the scanning directions) within the plane perpendicular to the Z axial direction is the X axial direction, and the direction perpendicular to the Z axial direction and the X axial direction (non-scanning direction) is the Y axial direction. In addition, the directions around the X, Y, and Z axes are the θX, θY, and θZ directions, respectively. Furthermore, "substrate" herein includes a semiconductor wafer coated with a photoresist, which is a photosensitive material, and "mask" includes a reticle wherein a device pattern, which is reduction projected onto the substrate, is formed.

The illumination optical system IL illuminates the mask M, which is supported by the mask stage MST, with the exposure light EL, and comprises: an exposure light source; an optical integrator that uniformizes the illuminance of the luminous flux emitted from the exposure light source; a condenser lens that condenses the exposure light EL from the optical integrator; a relay lens system; and a variable field stop that sets an illumination region on the mask M illuminated by the exposure light EL to be slit shaped; and the like. The illumination optical system IL illuminates the prescribed illumination region on the mask M with the exposure light EL, which has a uniform illuminance distribution. Examples of light that can be used as the exposure light EL emitted from the illumination optical system IL include: deep ultraviolet light (DUV light), such as the bright lines (g, h, and i lines) in the ultraviolet region emitted from a mercury lamp for example, and KrF excimer laser light (248 nm wavelength); and vacuum ultraviolet light (VUV light), such as ArF excimer laser light (193 nm wavelength) and $F_2$ laser light (157 nm wavelength).

ArF excimer laser light is used in the present embodiment. As discussed above, the liquid 1 in the present embodiment is pure water, and the exposure light EL can transmit therethrough even if it is light from an ArF excimer laser. In addition, deep ultraviolet light (DUV light), such as KrF excimer laser light (248 nm wavelength) and the bright lines (g, h, and i lines) in the ultraviolet region, can also transmit through pure water.

The mask stage MST supports the mask M and is two dimensionally movable in the plane perpendicular to the optical axis AX of the projection optical system PL, i.e., in the XY plane, and is finely rotatable in the θZ direction. A mask stage drive apparatus MSTD, such as a linear motor, drives the mask stage MST. The control apparatus CONT controls the mask stage drive apparatus MSTD. A movable mirror 50 is provided on the mask stage MST. In addition, a laser interferometer 51 is provided at a position opposing the movable mirror 50. The laser interferometer 51 measures in real time the position in the two dimensional direction as well as the rotational angle of the mask M on the mask stage MST, and outputs these measurement results to the control apparatus CONT. The control apparatus CONT drives the mask stage drive apparatus MSTD based on the measurement results of the laser interferometer 51, thereby positioning the mask M, which is supported by the mask stage MST.

The projection optical system PL projects and exposes the pattern of the mask M onto the substrate P at a prescribed projection magnification β, and comprises a plurality of optical elements, which includes the optical element (lens) 2 provided at the tip part on the substrate P side, that is supported by a lens barrel PK. In the present embodiment, the projection optical system PL is a reduction system that has a projection magnification β of, for example, ¼ or ⅕. Furthermore, the projection optical system PL may be a unity magnification system or an enlargement system. In addition, the optical element 2 at the tip part of the projection optical system PL of the present embodiment is detachably (replaceably) provided to the lens barrel PK, and the liquid 1 of the immersion area AR2 contacts the optical element 2.

The optical element 2 is made of fluorite. Because fluorite has a strong affinity for water, the liquid 1 can adhere to substantially the entire surface of a liquid contact surface 2a of the optical element 2. Namely, because the liquid (water) 1 supplied in the present embodiment has a strong affinity for the liquid contact surface 2a of the optical element 2, the liquid contact surface 2a of the optical element 2 and the liquid 1 have strong adhesion, and therefore the optical path between the optical element 2 and the substrate P can be reliably filled with the liquid 1. Furthermore, the optical element 2 may be made of quartz, which also has a strong affinity (hydrophilic) for water. In addition, the liquid contact surface 2a of the optical element 2 may be given hydrophilic (lyophilic) treatment in order to further raise its affinity for the liquid 1. In addition, because the vicinity of the tip of the lens barrel PK contacts the liquid (water) 1, at least the vicinity of the tip is made of a metal that is rust resistant, such as Ti (titanium).

The substrate stage PST supports the substrate P and comprises: a substrate table (stage) 52 that holds the substrate P via a substrate holder PH; an XY stage 53 that supports the substrate table 52; and a base 54 that supports the XY stage 53. A substrate stage drive apparatus PSTD, such as a linear motor, drives the substrate stage PST. The substrate stage drive apparatus PSTD is controlled by the control apparatus CONT. The position in the Z axial direction (the focus position) and in the θX and θY directions of the substrate P held on the substrate table 52 is controlled by driving the substrate table 52. In addition, the position of the substrate P in the X and Y directions (the position in the directions substantially parallel to the image plane of the projection optical system PL) is controlled by driving the XY stage 53. In other words, the substrate table 52 functions as a Z stage that controls the focus position and the inclination angle of the substrate P, and aligns the front surface of the substrate P with the image plane of the projection optical system PL by an auto focus system and an auto leveling system; further, the XY stage 53 positions the substrate P in the X axial direction and Y axial direction. Furthermore, the substrate table 52 and the XY stage 53 may of course be integrally provided.

Movable mirrors 55 are provided on the substrate stage PST (the substrate table 52). In addition, a laser interferometer 56 is provided at a position opposing each movable mirror 55. The laser interferometers 56 measure in real time the position in the two dimensional directions as well as the rotational angle of the substrate P on the substrate stage PST, and output these measurement results to the control apparatus CONT. The control apparatus CONT drives the substrate stage drive apparatus PSTD based on the measurement results of the laser interferometers 56, and thereby positions the substrate P supported on the substrate stage PST.

In addition, a ring shaped plate part 30 is provided on the substrate stage PST (substrate table 52) so that it surrounds the substrate P. The plate part 30 is fixed in a state that the outer circumference of the plate part 30 is mated to the substrate table 52, and a recessed part 32 is formed on the inner side of the plate part 30. Furthermore, the plate part 30 and the substrate table 52 may be provided integrally. The substrate holder PH that holds the substrate P is disposed in the recessed part 32 (refer to FIG. 4). The plate part 30 has a flat surface that is at a height substantially the same as the front surface PA of the substrate P, which is held by the substrate holder PH disposed in the recessed part 32. Furthermore, the details of the plate part 30 and the substrate holder PH will be discussed later.

The liquid supply mechanism 10 supplies the prescribed liquid 1 onto the substrate P, and comprises: a first liquid supply part 11 and a second liquid supply part 12 that are capable of supplying the liquid 1; a first supply member 13, which is connected to the first liquid supply part 11 via a supply pipe 11A having a passageway, that comprises a supply port 13A that supplies the liquid 1 fed from this first liquid supply part 11 onto the substrate P; and a second supply member 14, which is connected to the second liquid supply part 12 via a supply pipe 12A having a passageway, that comprises a supply port 14A that supplies the liquid 1 fed from this second liquid supply part 12 onto the substrate P. The first and second supply members 13, 14 are disposed proximate to the front surface of the substrate P, and are provided at mutually different positions in the surface directions of the substrate P. Specifically, the first supply member 13 of the liquid supply mechanism 10 is provided on one side (the −X side) of the projection area AR1 in the scanning direction, and the second supply member 14 is provided on the other side (the +X side).

Each of the first and second liquid supply parts 11, 12 comprises a tank, which stores the liquid 1, a pressure pump, and the like, and supplies the liquid 1 onto the substrate P through the supply pipes 11A, 12A and the supply members 13, 14. In addition, the liquid supply operation of the first and second liquid supply parts 11, 12 is controlled by the control apparatus CONT, which is capable of independently controlling the amount of liquid 1 supplied per unit of time by the first and second liquid supply parts 11, 12 onto the substrate P. In addition, each of the first and second liquid supply parts 11, 12 comprises a liquid temperature adjusting mechanism, and supplies the liquid 1 of a temperature substantially the same as that inside the chamber wherein the apparatus is housed (e.g., 23° C.) onto the substrate P.

The liquid recovery mechanism 20 recovers the liquid 1 on the substrate P, and comprises: first and second recovery members 23, 24, which comprise recovery ports 23A, 24A disposed proximate to the front surface of the substrate P; and first and second liquid recovery parts 21, 22, which are respectively connected to these first and second recovery members 23, 24 via recovery pipes 21A, 22A, which have passageways. Each of the first and second liquid recovery parts 21, 22 comprises: a suction apparatus, such as a vacuum pump; a tank that stores the recovered liquid 1; and the like; further, these first and second liquid recovery parts 21, 22 recover the liquid 1 on the substrate P via the first and second recovery members 23, 24 and the recovery pipes 21A, 22A. The liquid recovery operation of the first and second liquid recovery parts 21, 22 is controlled by the control apparatus CONT, which is capable of controlling the amount of liquid recovered by the first and second liquid recovery parts 21, 22 per unit of time.

Figure 2:
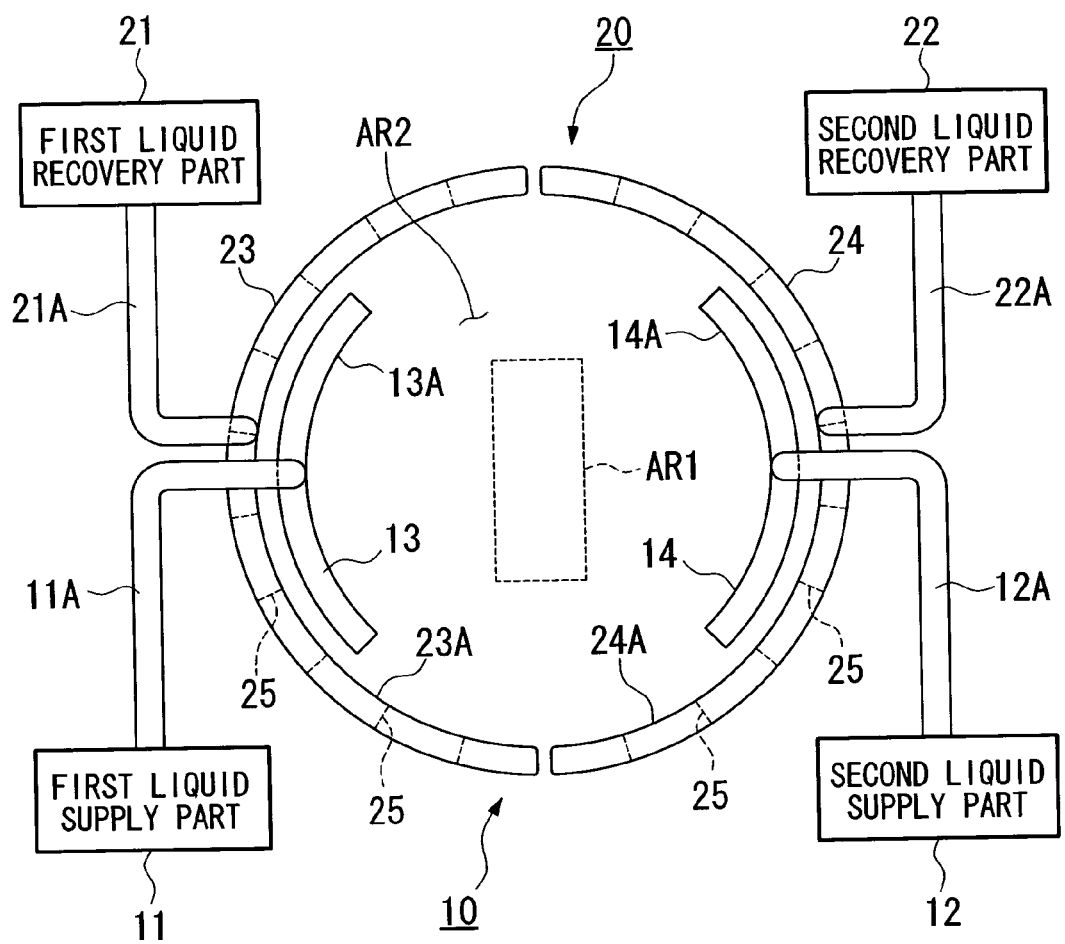
FIG. 2 is a schematic block diagram that depicts a liquid supply mechanism and a liquid recovery mechanism.

FIG. 2 is a plan view that schematically depicts the constitution of the liquid supply mechanism 10 and the liquid recovery mechanism 20. As depicted in FIG. 2, the projection area AR1 of the projection optical system PL is set to a slit shape (rectangular shape), wherein the longitudinal direction is in the Y axial direction (the non-scanning direction), and is formed on a part of the substrate P so that the immersion area AR2, which is filled with the liquid 1, includes the projection area AR1. Furthermore, the first supply member 13 of the liquid supply mechanism 10 for forming the immersion area AR2 which includes the projection area AR1, is provided on one side (the −X side) of the projection area AR1 in the scanning direction, and the second supply member 14 is provided on the other side (the +X side).

The first and second supply members 13, 14 are formed substantially arcuately in a plan view, and are set so that their supply ports 13A, 14A in the Y axial direction are at least larger than the projection area AR1 in the Y axial direction. Furthermore, the supply ports 13A, 14A, which are formed substantially arcuately in a plan view, are disposed so that the projection area AR1 is interposed therebetween in the scanning direction (the X axial direction). The liquid supply mechanism 10 simultaneously supplies the liquid 1 to both sides of the projection area AR1 via the supply ports 13A, 14A of the first and second supply members 13, 14.

The first and second recovery members 23, 24 of the liquid recovery mechanism 20 respectively comprise recovery ports 23A, 24A, which are arcuately and continuously formed so that they face the front surface of the substrate P. Furthermore, the first and second recovery members 23, 24, which are disposed so that they face one another, form substantially annular recovery port. The recovery ports 23A, 24A of the first and second recovery members 23, 24 are disposed so that they surround the first and second supply members 13, 14 of the liquid supply mechanism 10 as well as the projection area AR1. In addition, a plurality of partition members 25 is provided inside the recovery port, which is continuously formed so that it surrounds the projection area AR1.

The liquid 1 supplied onto the substrate P from the supply ports 13A, 14A of the first and second supply members 13, 14 is supplied so that it spreads between the substrate P and the lower end surface at the tip part (optical element 2) of the projection optical system PL. In addition, the liquid 1 that flows out to the outer side of the first and second supply members 13, 14 with respect to the projection area AR1 is recovered by the recovery ports 23A, 24A of the first and second recovery members 23, 24, which are disposed on the outer side of the first and second supply members 13, 14 with respect to the projection area AR1.

When performing a scanning exposure of the substrate P in the present embodiment, the amount of liquid 1 supplied per unit of time from the near side of the projection area AR1 in the scanning direction is set larger than that on the opposite side thereof. For example, if performing the exposure process while moving the substrate P in the +X direction, the control apparatus CONT sets the amount of liquid 1 supplied from the −X side of the projection area AR1 (i.e., the supply port 13A) greater than that from the +X side (i.e., the supply port 14A); on the other hand, when performing the exposure process while moving the substrate P in the −X direction, the amount of liquid 1 supplied from the +X side of the projection area AR1 is set greater than that from the −X side. In addition, the amount of liquid 1 recovered per unit of time on the near side of the projection area AR1 with respect to the scanning direction is set less than that on the opposite side. For example, when moving the substrate P in the +X direction, the amount of liquid 1 recovered from the +X side of the projection area AR1 (i.e., the recovery port 24A) is greater than that from the −X side (i.e., the recovery port 23A).

Figure 3:
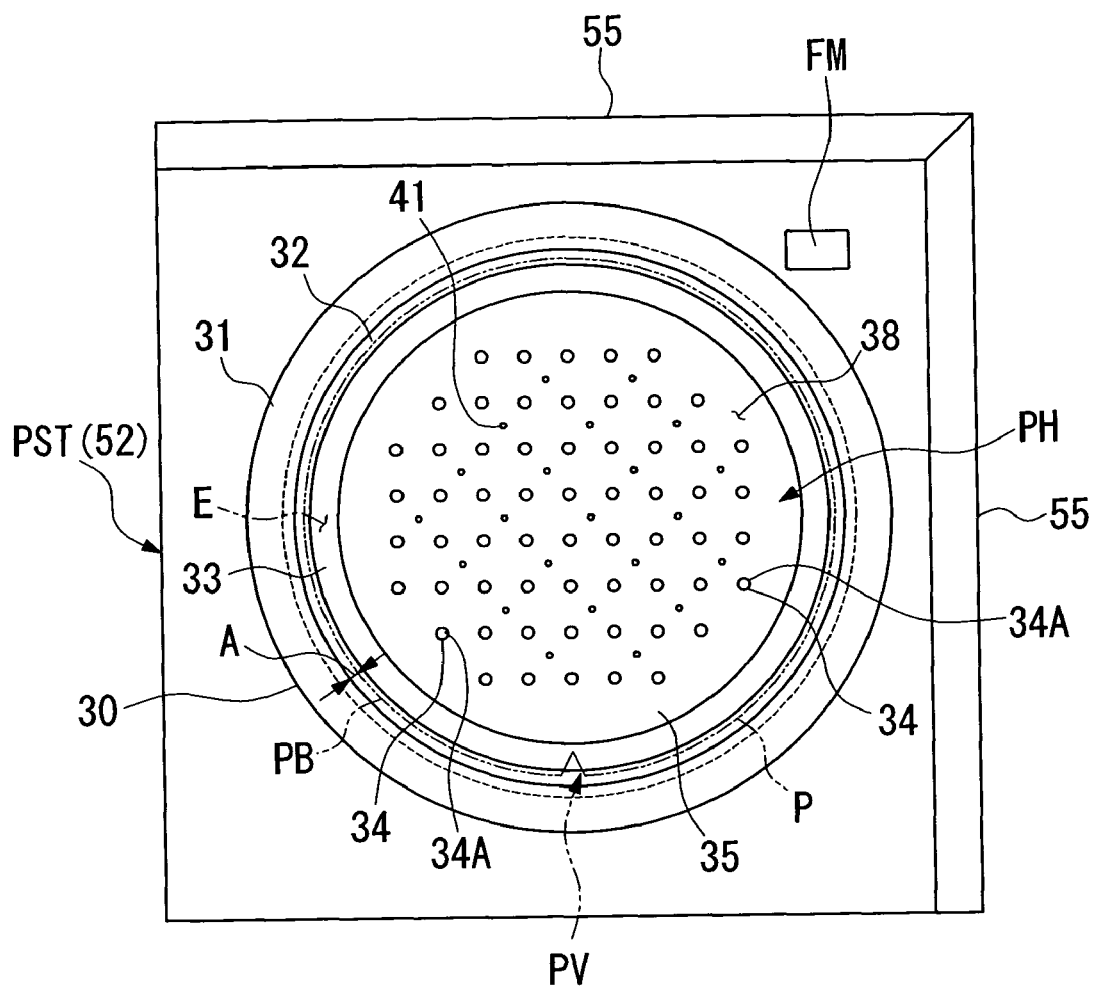
FIG. 3 is a plan view of a substrate stage.

FIG. 3 is a plan view of the substrate table 52 of the substrate stage PST, viewed from above. A movable mirror 55 is disposed at each of two mutually perpendicular edge parts of the substrate table 52, which is rectangularly shaped in a plan view. A fiduciary mark FM, which is used when aligning the mask M and the substrate P with respect to a prescribed position, is provided in the vicinity of the intersection part of the movable mirrors 55, 55. In addition, although not shown, various sensors, such as illuminance sensors and the like, are provided around the substrate P on the substrate stage PST.

Figure 4:
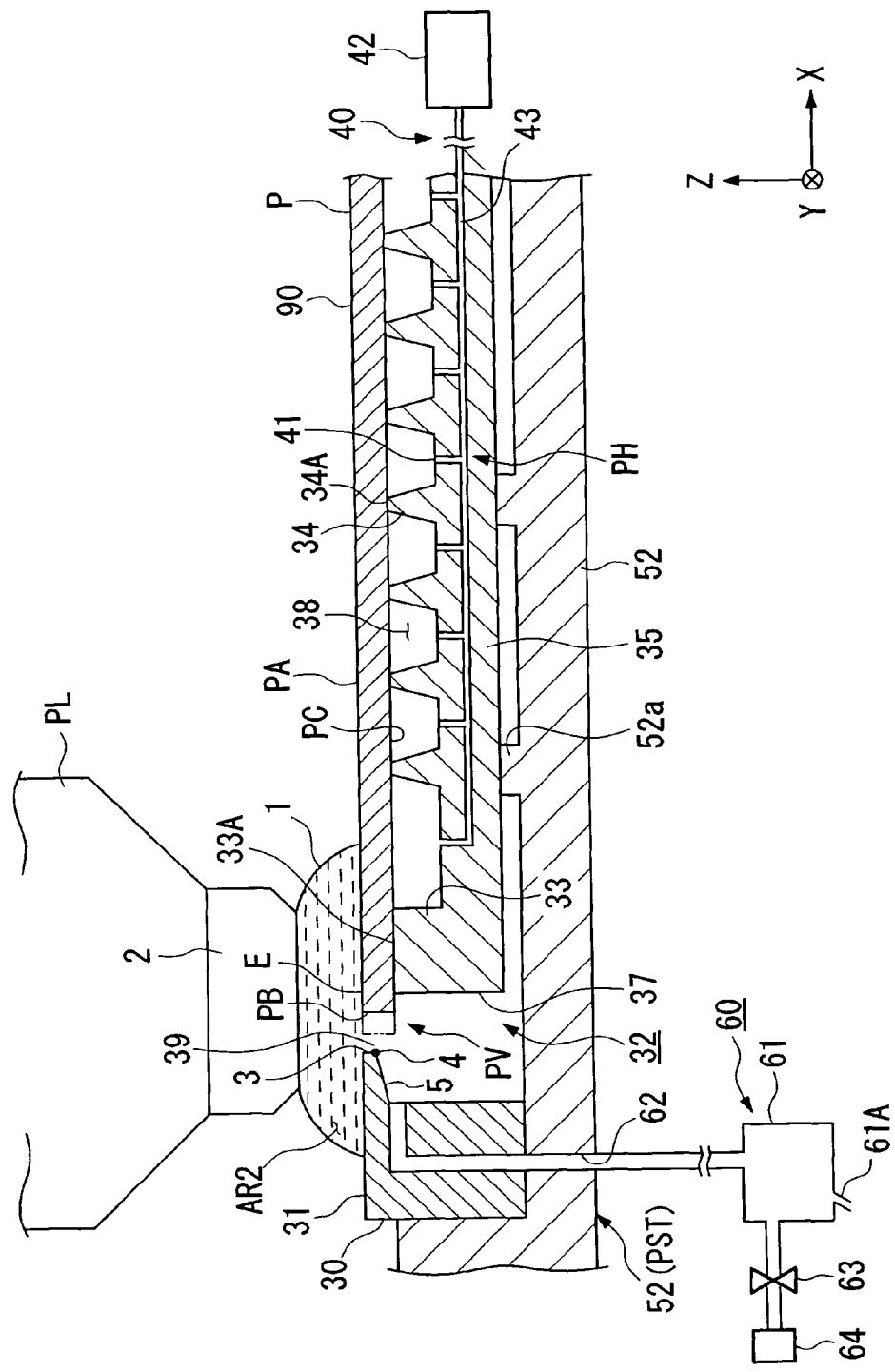
FIG. 4 is a cross sectional view of principle parts of the substrate stage according to the first embodiment.

In addition, a recessed part 32 is circularly formed, in a plan view, at the substantially center part of the substrate table 52, and a support part 52a is protrudingly provided to this recessed part 32 for supporting the substrate holder PH (refer to FIG. 4). Furthermore, the substrate holder PH, which holds the substrate P, is disposed inside the recessed part 32 in a state wherein the substrate holder PH is supported by the support part 52a, and wherein there is a gap between the substrate holder PH and the substrate table 52, as depicted in FIG. 4. Furthermore, the pressure in the gap between the substrate table 52 and the substrate holder PH is set to atmospheric pressure (open). Furthermore, the plate part 30, which has a flat surface 31 that is at a height substantially the same as the front surface of the substrate P, is provided around the substrate P.

The substrate holder PH comprises a substantially annular circumferential wall part 33, which holds a rear surface PC of the substrate P on the inner side of the outer circumference of the substrate P, and a plurality of support parts 34, which are disposed on the inner side of the circumferential wall part 33, that hold the substrate P. The circumferential wall part 33 and the support parts 34 are provided on a substantially discoid base part 35, which constitutes part of the substrate holder PH. The support parts 34 are each trapezoidal in a cross sectional view, and the rear surface PC of the substrate P is held on an upper end surface (substrate holding surface) 33A of the circumferential wall part 33 and an upper end surface (substrate holding surface) 34A of each of the plurality of support parts 34. The support parts 34 are evenly disposed on the inner side of the circumferential wall part 33. In the present embodiment, among the surfaces of the substrate holder PH, the upper end surface 33A of the circumferential wall part 33 and a side surface 37 are liquid repellent. Liquid repellency treatments used on the substrate holder PH include coating it with a fluororesin material or a liquid repellent material, such as acrylic resin material, or adhering a thin film consisting of the abovementioned liquid repellent material. Liquid repellent materials used to impart liquid repellency include materials that are insoluble in the liquid 1.

FIG. 4 is an enlarged cross sectional view of principle parts of the substrate stage PST, which holds the substrate P.

The ring shaped plate part 30 is installed inside the recessed part 32 so that its outer circumference mates with the substrate table 52, and comprises an inner circumferential surface 3, which is formed thinner than the thickness of the substrate P and opposes a side surface (outer circumferential part) PB of the substrate P, and an inclined surface (inclined part) 5, which has a starting point at a lower end part 4 (first portion) of the inner circumferential surface 3 and slopes gradually downward toward the outer side. The upper end part 4 (i.e., the lower end part of the inner circumferential surface 3) of the inclined surface 5 is disposed at a position higher than the upper end surface 33A of the circumferential wall part 33 and the upper end surfaces 34A of the support parts 34.

In the present embodiment, the flat surface 31 of the plate part 30 is liquid repellent with respect to the liquid 1, and the inner circumferential surface 3 and the inclined surface 5 of the plate part 30 are lyophilic with respect to the liquid 1. The same processes used in the substrate holder PH discussed above can be adopted for the liquid repellency treatment of the flat surface 31. In addition, the inner circumferential surface 3 and the inclined surface 5 can be lyophilically treated by, for example, ultraviolet light irradiation, plasma treatment that uses oxygen as the reaction gas and exposure to an ozone atmosphere. Furthermore, the plate part 30 may be made of a liquid repellent material (fluororesin and the like), and the inner circumferential surface 3 and the inclined surface 5 may be given the abovementioned lyophilic treatment, or provided with a lyophilic metal (or metal film) adhered thereto (or formed by film deposition).

In addition, a suction apparatus 60 is provided to the plate part 30 that suctions the liquid that flows into a space 39, which is formed between the plate part 30 and the side surface PB of the substrate P. In the present embodiment, the suction apparatus 60 comprises: a tank 61 that is capable of storing the liquid 1; a passageway 62, which is provided inside the plate part 30 and the substrate table 52, that connects the space 39 and the tank 61; and a pump 64 that is connected to the tank 61 via a valve 63. Furthermore, this passageway 62 is open to the space 39 in the vicinity of (below) a lower end part of the inclined surface 5, and the inner wall surface of the passageway 62 is also given the abovementioned liquid repellency treatment.

The recovery apparatus according to the present invention comprises the suction apparatus 60, as well as the lyophilic inner circumferential surface 3 and the inclined surface 5 of the plate part 30.

Furthermore, the front surface PA, which is the exposure surface of the substrate P, is coated with a photoresist (photosensitive material) 90. In the present embodiment, the photosensitive material 90 is a photosensitive material (e.g., TARF-P6100 manufactured by Tokyo Ohka Kogyo Co., Ltd.) for ArF excimer laser light, is liquid repellent (water repellent), and has a contact angle of approximately 70-80°. In addition, in the present embodiment, the side surface PB of the substrate P is given liquid repellency treatment (water repellency treatment). Specifically, the side surface PB of the substrate P is also coated with the abovementioned liquid repellent photosensitive material 90. Furthermore, the rear surface PC of the substrate P is also given liquid repellency treatment by coating it with the abovementioned photosensitive material 90.

In addition, a V shaped notched part PV is formed in the outer circumference of the substrate P for aligning the substrate P (refer to FIG. 3). Furthermore, a cross section of the notched part PV is depicted in FIG. 4, and the outer circumference of the substrate beyond the notched part PV is depicted by a chain double-dashed line. In this case, the gap between the substrate outer circumference beyond the notched part PV and the inner circumferential surface 3 of the plate part 30 is, for example, 0.3-0.5 mm, and the gap between the substrate outer circumference of the notched part PV and the inner circumferential surface 3 of the plate part 30 is, for example, 1.5-2.0 mm.

On the other hand, the substrate stage PST comprises a suction apparatus 40 that supplies negative pressure to a space 38, which is surrounded by the circumferential wall part 33 of the substrate holder PH. The suction apparatus 40 comprises: a plurality of suction ports 41, which are provided to the upper surface of the base part 35 of the substrate holder PH; a vacuum part 42, which includes a vacuum pump provided outside of the substrate stage PST; and a passageway 43, which is formed inside the base part 35 and connects the vacuum part 42 to each of the plurality of suction ports 41. The suction ports 41 are provided at a plurality of prescribed locations different from the support parts 34 on the upper surface of the base part 35. The suction apparatus 40 suctions the gas (air) inside the space 38 formed between the circumferential wall part 33, the base part 35, and the substrate P, which is held by the support parts 34, and holds the substrate P by suction to the circumferential wall part 33 and the support parts 34 by creating a negative pressure in the space 38. The control apparatus CONT controls the operation of the recovery apparatus (suction apparatus 60) and the suction apparatus 40.

The following explains the method by which the exposure apparatus EX, having the constitution discussed above, performs immersion exposure of an edge area E of the substrate P.

When performing immersion exposure of the edge area E of the substrate P as depicted in FIG. 4, the liquid 1 of the immersion area AR2 is disposed at part of the front surface PA of the substrate P and part of the flat surface 31 of the plate part 30. At this time, if the edge area E to be exposed is at a position where the notched part PV of the substrate P is not provided, then, because the front surface PA of the substrate P and the flat surface 31 of the plate part 30 are given liquid repellency treatment, and because a gap (hereinbelow, referred to as gap A) therebetween is not large, it is difficult for the liquid 1 of the immersion area AR2 to infiltrate the gap A and virtually no liquid 1 flows therein due to the surface tension of the liquid 1.

On the other hand, if the edge area E to be exposed is at the notched part PV of the substrate P, then there is a possibility that the liquid 1 will infiltrate the space 39 depicted in FIG. 4 because the gap between the outer circumference PB of the substrate P and the inner circumferential surface 3 of the plate part 30 increases to, for example, approximately 2 mm.

Here, because the outer circumference PB of the substrate P is liquid repellent and the inner circumferential surface 3 and the inclined surface 5 of the plate part 30 are lyophilic, the liquid 1 that flows into the space 39 moves (travels) from the inner circumferential surface 3 to the inclined surface 5 due to its own weight and the force of the affinity with the inner circumferential surface 3, and arrives at the opening part of the passageway 62. By continuously operating the pump 64 of the suction apparatus 60, the negative pressure increases when the liquid 1 blocks the passageway 62, and the liquid 1 that arrives at the opening part thereof can consequently be suctioned into and recovered in the tank 61 through the passageway 62. The tank 61 is provided with a discharge passageway 61A, which discharges the liquid 1 when a prescribed amount has accumulated.

Furthermore, even in the event that the liquid 1 travels around to the rear surface PC of the substrate P, it is possible to prevent the infiltration of the liquid 1 into the space 38 from the gap between the rear surface PC and the circumferential wall part 33 because the rear surface PC and the upper end surface 33A of the circumferential wall part 33 are liquid repellent.

In addition, the inside of the recessed part 32 is open to atmospheric pressure; consequently, the pressure therein is held at a constant level in the state wherein the liquid 1 does not block the passageway 62, vibrations attendant with the suction operation are not transmitted to the substrate P, and it is therefore possible to prevent adverse effects due to those vibrations.

In addition, a gap is formed in the plate part 30 between the recovery members 23, 24 of the liquid recovery mechanism 20, but the flat surface 31 is liquid repellent and it is therefore possible to prevent the liquid 1 from flowing out of this gap and to avoid hindering the exposure process.

Thus, the present embodiment prevents the liquid 1 from traveling around to the space between the substrate P and the holder PH (the circumferential wall part 33), even when exposing the edge area E of the substrate P, and it is therefore possible to perform immersion exposure while satisfactorily holding the liquid 1 below the projection optical system PL. Particularly, with the present embodiment, the liquid 1 that flows into the space 39 can be easily recovered using the inner circumferential surface 3 and the inclined surface 5, which are lyophilic parts, to guide the liquid 1 to the passageway 62 of the suction apparatus 60, which is at a position spaced apart from the substrate P, and it is therefore possible to prevent the liquid 1 from traveling around the notched part PV and to satisfactorily perform immersion exposure, even if using a substrate P wherein a notched part PV for alignment is formed. Furthermore, with the present embodiment, the upper end part 4 of the inclined surface 5 is positioned higher than the upper end surface 33A, which is the substrate holding surface, and it is consequently possible to guide the liquid 1 that flows into the space 39 to the inclined surface 5 before it reaches the upper end surface 33A, thereby making the suctioning and recovery of the liquid 1 more reliable.

In addition, with the present embodiment, the side surface 37 and the upper end surface 33A of the circumferential wall part 33 of the substrate holder PH are liquid repellent, and it is therefore possible to prevent the infiltration of the liquid 1 into the space 38, even if the liquid 1 travels around to the rear surface side of the substrate P. In addition, because the flat surface 31 of the plate part 30 is given liquid repellency treatment, the liquid 1 that forms the immersion area AR2 is prevented from excessively spreading to the outer side of the plate part 30, which makes it possible to satisfactorily form the immersion area AR2 and prevent problems such as the outflow, dispersion, and the like of the liquid 1.

Second Embodiment

Figure 5:
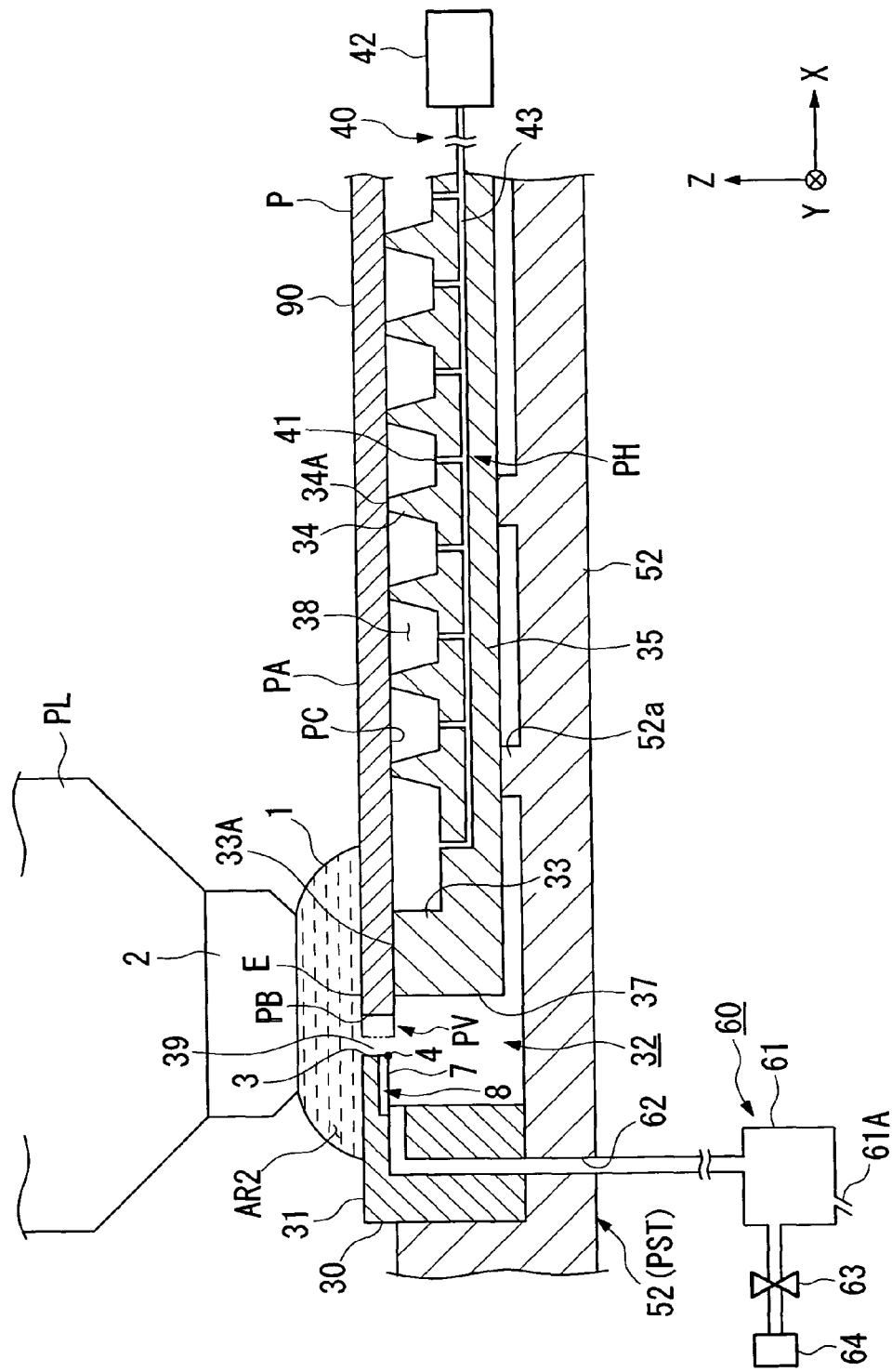
FIG. 5 is a cross sectional view of principle parts of the substrate stage according to the second embodiment.
Figure 6:
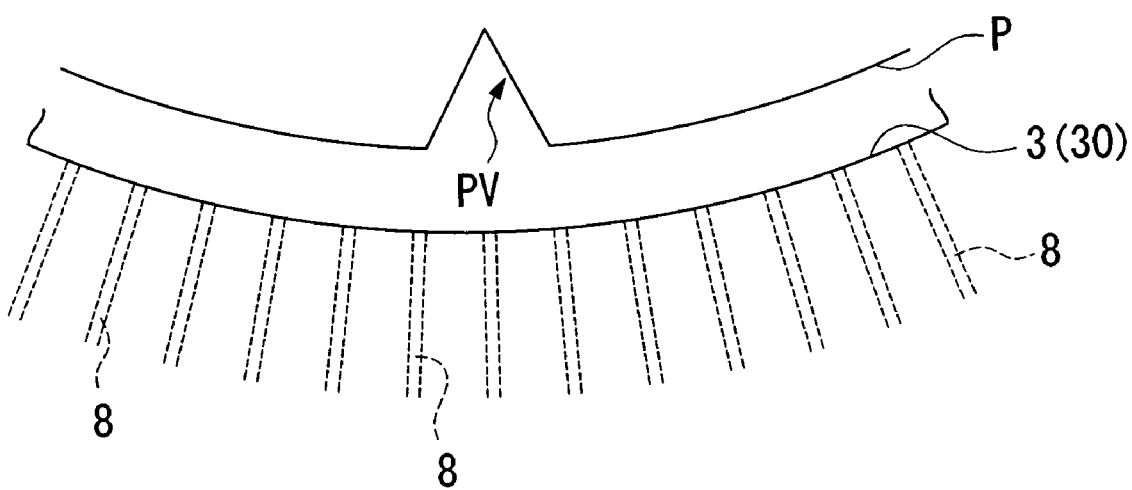
FIG. 6 is an enlarged plan view of the substrate stage according to the second embodiment.

FIG. 5 and FIG. 6 depict the second embodiment of the stage apparatus of the present invention.

With the first embodiment, the liquid 1 travels to the inclined surface of the plate part 30 due to its own weight, and is guided in a direction away from the substrate P; however, the second embodiment adopts a constitution wherein the liquid 1 is suctioned using the capillary phenomenon.

The following explanation is made referencing FIG. 5 and FIG. 6.

Furthermore, constituent elements in FIG. 5 and FIG. 6 that are identical to those in the first embodiment, which is depicted in FIG. 4 and the like, are assigned the identical symbols, and the explanations thereof are omitted.

As depicted in FIG. 5, the plate part 30 in the present embodiment comprises a rear surface 7 extending in the horizontal direction (substantially parallel to the substrate holding surface 33A) from the lower end part 4, which serves as a base end, of the inner circumferential surface 3. A plurality of slits (recessed parts) 8 is provided to the rear surface 7, wherein one end of each slit 8 is open to the space 39 formed between the side surface PB of the substrate P and the inner circumferential surface 3.

As depicted in the partial enlarged plan view of FIG. 6, each slit 8 has a minute width, and the slits 8 are radially formed at prescribed intervals around the entire circumference of the inner circumferential surface 3. Furthermore, the opening part of the passageway 62 of the suction apparatus 60 is disposed at the tip parts of the slits 8. The bottom surface 7 that includes the slits 8 is given the abovementioned lyophilic treatment, and is therefore lyophilic.

Furthermore, to facilitate understanding, FIG. 6 depicts a state wherein the number of slits 8 is reduced, but actually numerous slits 8 are formed at a micropitch so that the liquid 1 can be effectively suctioned.

Other aspects of the constitution of the present embodiment are the same as the abovementioned first embodiment.

With the present embodiment, the liquid 1 that flows into the space 39 is sucked into the slits 8 by the force of its affinity therewith and by the capillary phenomenon, and is suctioned and recovered from the end parts of the slits 8 through the passageway 62; consequently, the liquid 1 can be prevented from traveling around to the rear surface side of the substrate P, and an immersion exposure can be satisfactorily performed.

Furthermore, a constitution wherein the slits of the present embodiment are adapted to the inclined surface 5 in the first embodiment would also be suitable. In this case, the suction force due to the capillary phenomenon is added to the self weight of the liquid 1, which raises the suction force and enables more reliable suctioning and recovery thereof.

Third Embodiment

Figure 7:
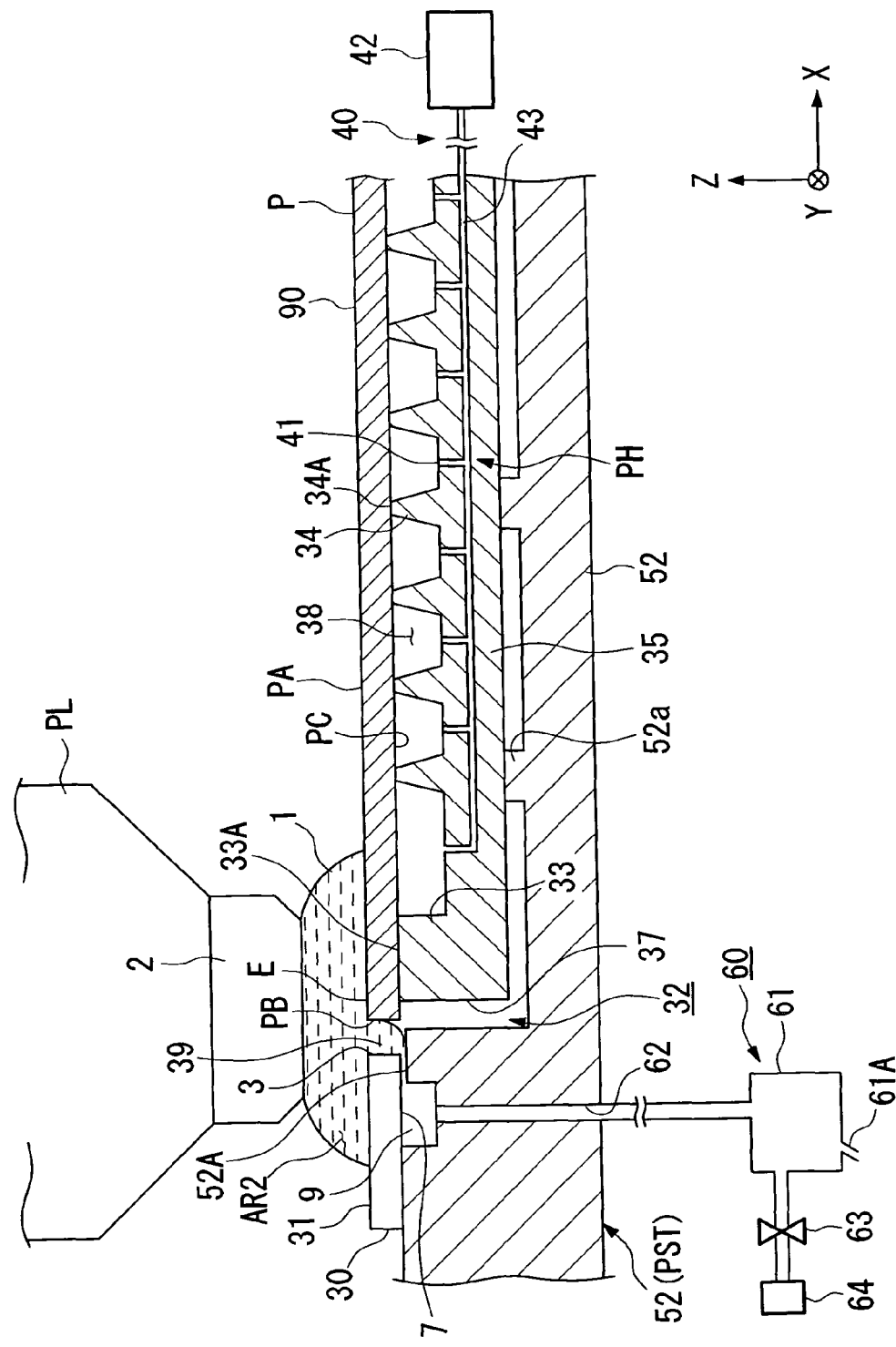
FIG. 7 is a cross sectional view of principle parts of the substrate stage according to the third embodiment.

FIG. 7 depicts the third embodiment of the stage apparatus of the present invention.

With the present embodiment, the liquid 1 is suctioned and recovered using the lyophilic parts and the suction pressure differential with respect to the plate part 30 and the substrate P.

The following explanation is made referencing FIG. 7.

Furthermore, in FIG. 7, constituent elements that are identical to those in the first embodiment, which is depicted in FIG. 4 and the like, are assigned the identical symbols, and the explanations thereof are omitted.

As depicted in FIG. 7, the plate part 30 in the present embodiment is formed in a ring plate shape, and is mounted and fixed onto the substrate table 52. A groove 9, which is upwardly open, is formed in the substrate table 52 around its entire circumference at a position wherein it is covered by the plate part 30. Furthermore, the passageway 62 of the suction apparatus 60 is provided to the substrate table 52, and connects the groove 9 and the tank 61. In addition, a step part 52A, which forms a micro gap between the substrate table 52 and the rear surface 7 of the plate part 30, is formed on the inner circumferential side of the groove 9 in the substrate table 52, and the groove 9 and the space 39 are in communication through this gap. The step part 52A and the rear surface 7 of the plate part 30 are lyophilic parts that have been given the lyophilic treatment discussed above.

With the exposure apparatus EX constituted as mentioned above, the control apparatus CONT controls the suction apparatuses 40, 60 so that the negative pressure suction force that applies suction to the interior of the groove 9 is greater than the negative pressure suction force that suctions the space 38 in order to hold the substrate P to the substrate holder PH. Accordingly, if the liquid 1 flows into the space 39, the negative pressure in the groove 9 (the plate part 30 side) is greater than the negative pressure in the space 38 (the substrate holder PH side), and consequently the liquid 1 is suctioned into the groove 9 through the gap between the rear surface 7 of the plate part 30 and the step part 52A of the substrate table 52, and is further suctioned into and recovered in the tank 61 through the passageway 62. Particularly, with the present embodiment, the rear surface PC of the substrate P and the upper end surface 33A of the substrate holder PH (the circumferential wall part 33) are liquid repellent, whereas the rear surface 7 of the plate part 30 and the step part 52A of the substrate table 52 are lyophilic, and it is consequently possible to easily suction and reliably recover the liquid 1 to the plate part 30 side by the force of their affinity to the liquid 1.

Figure 8:
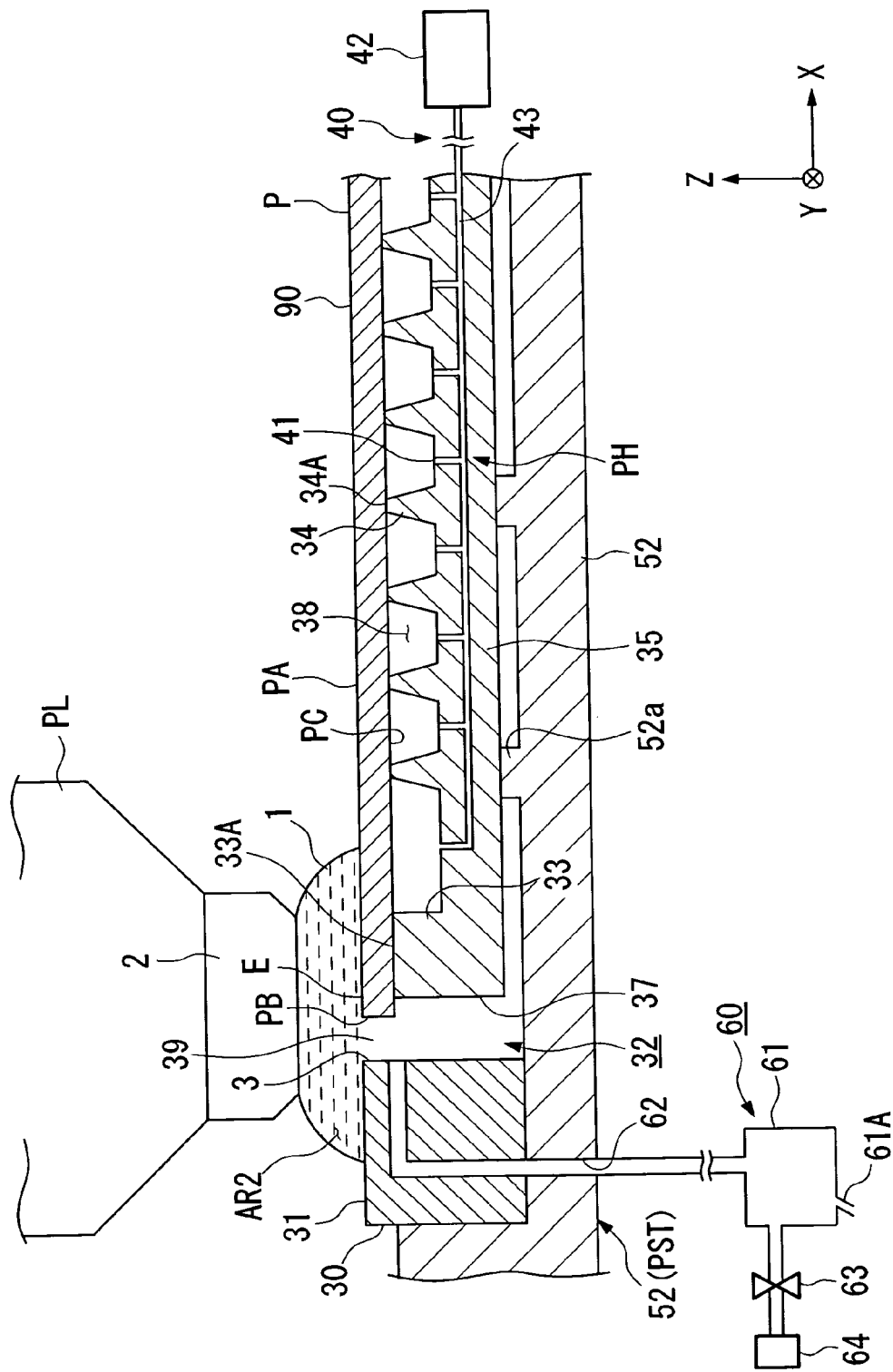
FIG. 8 is a cross sectional view of principle parts of the substrate stage according to another embodiment.

Furthermore, with the abovementioned first embodiment, the plate part 30 comprises the lyophilic inner circumferential surface 3 and the inclined surface 5, but the present invention is not limited thereto; as depicted in FIG. 8, the inner circumferential surface 3 may be formed across the entire thickness of the plate part 30, without forming the inclined surface. In this case, the inner circumferential surface 3 is given lyophilic treatment, and may be provided with the opening part of the passageway 62 of the suction apparatus 60.

With the abovementioned constitution, the liquid 1 that flows into the space 39 travels to the inner circumferential surface 3 due to its own weight and its lyophilicity with the inner circumferential surface 3, and is suctioned into and recovered in the tank 61 through the passageway 62, consequently the same effects as those in the abovementioned first embodiment are obtained.

Furthermore, the entire surface of the flat surface 31 of the plate part 30 in the abovementioned embodiments does not need to be liquid repellent, but at least the position opposing the first and second recovery members 23, 24 of the liquid recovery mechanism 20 should be liquid repellent. In addition, the entire surface of the substrate holder PH as well does not need to be liquid repellent, but the upper end surface 33A of the circumferential wall part 33 that opposes the rear surface PC of the substrate P as well as the side surface 37 that opposes the plate part 30 (space 39) should be liquid repellent.

Likewise for hydrophilicity, the slits 8 in the second embodiment, for example, should be lyophilic, but the rear surface 7 does not necessarily need to be so.

In addition, the entire surfaces of the front surface PA, the side surface PB, and the rear surface PC of the substrate P in the abovementioned embodiments is coated with the photosensitive material 90 in order to give them liquid repellency treatment, but a constitution may be adopted wherein only the side surface PB of the substrate P and the area of the rear surface PC of the substrate P that opposes the circumferential wall part 33 are given liquid repellency treatment.

The side surface PB and the rear surface PC of the substrate P are coated with a liquid repellent photosensitive material 90 as the liquid repellency treatment, but they may be coated with a liquid repellent (water repellent) prescribed material other than the photosensitive material 90. For example, there are cases wherein the upper layer of the photosensitive material 90, which is coated on the front surface PA that is the exposure surface of the substrate P, is coated with, for example, a protective layer (a film that protects the photosensitive material 90 from the liquid) called a topcoat layer, and the material that forms this topcoat layer (e.g., fluororesin material) is liquid repellent (water repellent) at a contact angle of, for example, approximately 110°. Accordingly, the side surface PB, the rear surface PC of the substrate P are coated with this topcoat layer forming material. Of course, they may be coated with a liquid repellent material other than the photosensitive material 90 and the topcoat layer forming material.

Likewise, it was explained that, as the liquid repellency treatment, the substrate stage PST and the substrate holder PH may be coated with a fluororesin material or an acrylic resin material but they may be coated with the abovementioned photosensitive material or the topcoat layer forming material; conversely, the side surface PB and the rear surface PC of the substrate P may be coated with the material used in the liquid repellency treatment of the substrate stage PST and the substrate holder PH.

It is often the case that the abovementioned topcoat layer is provided in order to prevent the infiltration of the liquid 1 of the immersion area AR2 into the photosensitive material 90; however, even if an adhered residue (a so-called watermark) of the liquid 1 is formed, for example, on the topcoat layer, eliminating the topcoat layer after the immersion exposure can eliminate the watermark together with the topcoat layer, and the subsequent prescribed process, such as the development process, can then be performed. Here, if the topcoat layer is made of, for example, a fluororesin material, then it can be eliminated using a fluorine based solvent. Thereby, there is no longer a need for apparatuses and the like (e.g., a substrate cleaning apparatus for removing watermarks) in order to eliminate the watermark, and the prescribed processes can be satisfactorily performed after the watermark has been eliminated by a simple constitution that eliminates the topcoat layer with a solvent.

In addition, the abovementioned embodiments explained that a notched part, which is V shaped in a plan view, is provided for aligning the substrate P, but the present invention can also be adapted to a substrate provided with a so-called orientation flat, wherein the substrate P is notched in a direction orthogonal to the radial direction, and of course can also be adapted to a substrate wherein a notched part for alignment is not formed.

The liquid 1 in each of the abovementioned embodiments comprises pure water. Pure water is advantageous because it can be easily obtained in large quantities at a semiconductor fabrication plant and the like, and because pure water has no adverse impact on the optical elements (lenses), the photoresist on the substrate P, and the like. In addition, because pure water has no adverse impact on the environment and has an extremely low impurity content, it can also be expected to have the effect of cleaning the surface of the substrate P and the surface of the optical element provided on the tip surface of the projection optical system PL. Furthermore, PFPE (fluoropolyether) may be used as the liquid 1.

Further, because the refractive index n of pure water (water) for the exposure light EL that has a wavelength of approximately 193 nm is substantially 1.44, the use of ArF excimer laser light (193 nm wavelength) as the light source of the exposure light EL would shorten the wavelength on the substrate P to 1/n, i.e., approximately 134 nm, thereby obtaining a high resolution. Furthermore, because the depth of focus will increase approximately n times, i.e., approximately 1.44 times, that of in air, the numerical aperture of the projection optical system PL can be further increased if it is preferable to ensure a depth of focus approximately the same as that when used in air, and the resolution is also improved from this standpoint.

In the present embodiment, the optical element 2 is attached to the tip of the projection optical system PL, and this lens can adjust the optical characteristics, e.g., aberrations (spherical aberration, coma aberration, and the like), of the projection optical system PL. Furthermore, the optical element attached to the tip of the projection optical system PL may be the optical plate used to adjust the optical characteristics of the projection optical system PL. Alternatively, it may be a parallel plate capable of transmitting the exposure light EL.

Furthermore, if the pressure generated by the flow of the liquid 1 between the optical element 2 at the tip of the projection optical system PL and the substrate P is high, then the optical element 2 may be rigidly fixed so that it does not move by that pressure, instead of making that optical element 2 exchangeable.

In addition, the present embodiment is constituted so that the liquid 1 is filled between the projection optical system PL and the surface of the substrate P, but it may be constituted so that, for example, the liquid 1 is filled in a state wherein a cover glass, comprising a parallel plate, is attached to the surface of the substrate P.

Furthermore, although the liquid 1 in the present embodiment is water, it may be a liquid other than water. For example, if the light source of the exposure light EL is an $F_2$ laser, then the $F_2$ laser light will not transmit through water, so it would be acceptable to use as the liquid 1 a fluorine based fluid, such as fluorine based oil, that is capable of transmitting $F_2$ laser light. In addition, it is also possible to use as the liquid 1 a liquid (e.g., cedar oil) that is transparent to the exposure light EL, has the highest possible refractive index, and is stable with respect to the projection optical system PL and to the photoresist coated on the surface of the substrate P. In this case as well, the surface treatment is performed in accordance with the polarity of the liquid 1 used.

Furthermore, the substrate P in each of the abovementioned embodiments is not limited to a semiconductor wafer for fabricating semiconductor devices, and is also applicable to a glass substrate for a display device, a ceramic wafer for a thin film magnetic head, or a mask or original plate of a reticle (synthetic quartz, silicon wafer) used by an exposure apparatus, and the like.

In addition to a step-and-scan system scanning type exposure apparatus (scanning stepper) that scans and exposes the pattern of the mask M by synchronously moving the mask M and the substrate P, a step-and-repeat system projection exposure apparatus (stepper) that exposes the full pattern of the mask M, with the mask M and the substrate P in a stationary state, and sequentially steps the substrate P is also applicable as the exposure apparatus EX. In addition, the present invention is also applicable to a step-and-stitch system exposure apparatus that transfers at least two patterns partially and superimposingly onto the substrate P.

In addition, the present invention is also applicable to the twin stage type scanning steppers disclosed in Japanese Unexamined Patent Application, First Publication No. H10-163099, Japanese Unexamined Patent Application, First Publication No. H10-214783, Published Japanese Translation No. 2000-505958 of the PCT International Publication, and the like.

The type of exposure apparatus EX is not limited to semiconductor device fabrication exposure apparatuses that expose the pattern of a semiconductor device on the substrate P, but is also widely applicable to exposure apparatuses for fabricating liquid crystal display devices or displays, for fabricating thin film magnetic heads, imaging devices (CCDs), reticles and masks, and the like.

If a linear motor (refer to U.S. Pat. No. 5,623,853 and U.S. Pat. No. 5,528,118) is used in the substrate stage PST or the mask stage MST, then either an air levitation type, which uses an air bearing, or a magnetic levitation type, which uses Lorentz's force or reactance force, may be used. In addition, each of the stages PST, MST may be a type that moves along a guide or may be a guideless type.

For the drive mechanism of each of the stages PST, MST, a planar motor may be used that opposes a magnet unit, wherein magnets are disposed two dimensionally, to an armature unit, wherein coils are disposed two dimensionally, and drives each of the stages PST, MST by electromagnetic force. In this case, either the magnet unit or the armature unit is connected to the stages PST, MST and the other one, which is either the magnet unit or the armature unit, should be provided on the moving surface side of the stages PST, MST.

The reaction force generated by the movement of the substrate stage PST may be mechanically discharged to the floor (ground) using a frame member so that it is not transmitted to the projection optical system PL, as recited in Japanese Unexamined Patent Application, First Publication No. H08-166475 (U.S. Pat. No. 5,528,118).

The reaction force generated by the movement of the mask stage MST may be mechanically discharged to the floor (ground) using a frame member so that it is not transmitted to the projection optical system PL, as recited in Japanese Unexamined Patent Application, First Publication No. H08-330224 (U.S. Pat. No. 5,874,820). In addition, the reaction force may be eliminated by using the law of the conversation of momentum, as recited in Japanese Unexamined Patent Application, First Publication No. 8-63231 (U.S. Pat. No. 6,255,796).

The exposure apparatus EX of the embodiments in the present application is manufactured by assembling various subsystems, including each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes the mutual mechanical connection of the various subsystems, the wiring and connection of electrical circuits, the piping and connection of the pneumatic circuit, and the like. Naturally, before process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein the temperature, the cleanliness level, and the like are controlled.

Figure 9:
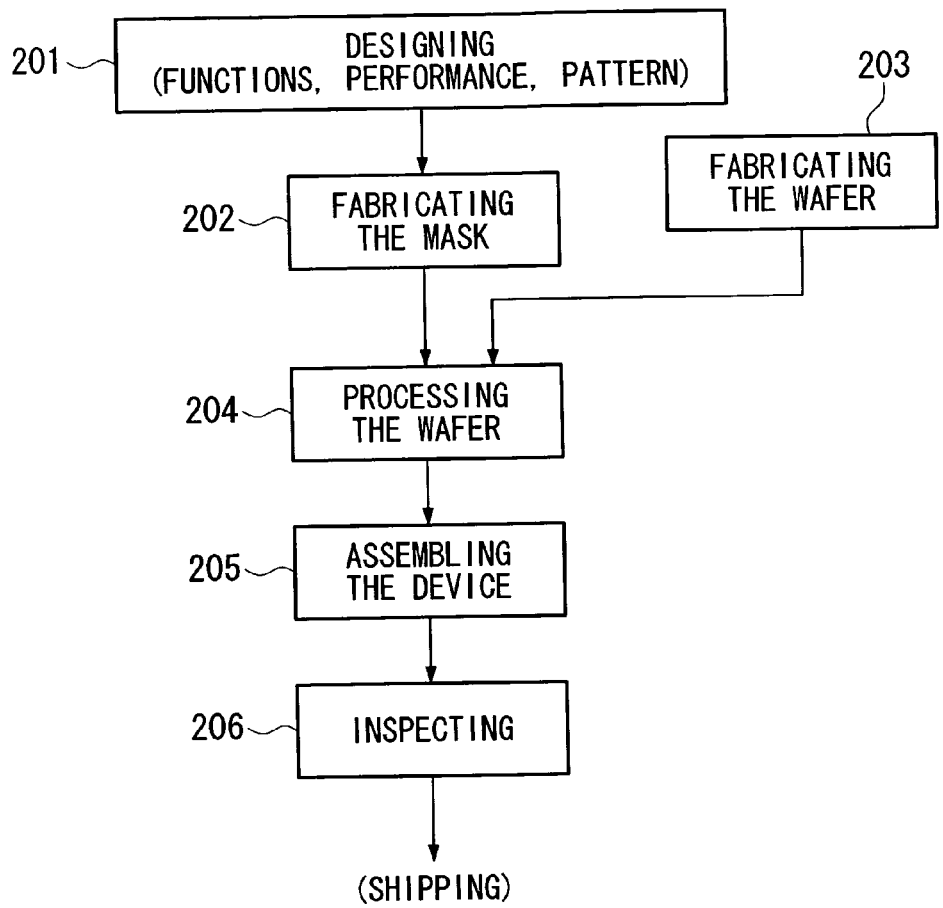
FIG. 9 is a flow chart diagram that depicts one example of a process of fabricating a semiconductor device.
Figure 10:
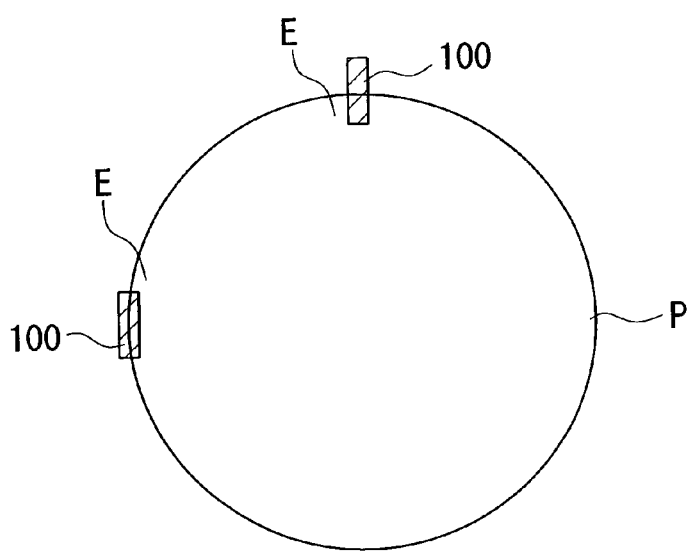
FIG. 10 is a schematic diagram for explaining the problems with the conventional exposure method.

As shown in FIG. 9, a micro-device, such as a semiconductor device is manufactured by: a step 201 that designs the functions and performance of the micro-device; a step 202 that fabricates a mask (reticle) based on this design step; a step 203 that fabricates a substrate, which is the base material of the device; an exposure processing step 204 wherein the exposure apparatus EX of the embodiments discussed above exposes a pattern of the mask onto the substrate; a device assembling step 205 (comprising a dicing process, a bonding process, and a packaging process); an inspecting step 206; and the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An exposure apparatus comprising:
a projection optical system by which an image of a pattern is projected onto an upper surface of a substrate; and
a stage apparatus, the stage apparatus including:
a holder having a substrate holding surface on which the substrate is held:
a member—that is disposed in a vicinity of the holder radially outward of an outer circumferential part of the substrate held by the holder, the member including a protruding portion that protrudes radially inward toward and opposes a side surface of the outer circumferential part of the substrate held on the holder such that a gap is provided between the protruding portion and the side surface of the outer circumferential part of the substrate held by the holder, the protruding portion having a downward facing lyophilic surface that faces downward and is disposed lower than the upper surface of the substrate held by the holder; and
a recovery device that recovers the liquid leaked from the gap using the lyophilic surface.

2. An exposure apparatus according to claim 1, wherein the recovery device has a suction device that suctions the liquid guided to the lyophilic surface.

3. An exposure apparatus according to claim 2, wherein suction force of the suction device by which the liquid is recovered is greater than suction force by which the substrate is held on the holder.

4. An exposure apparatus according to claim 2, wherein the suction device includes a passage disposed below the protruding portion, and the protruding portion has an inclined portion, which is inclined toward the passage of the suction device, the inclined portion having the downward facing lyophilic surface.

5. An exposure apparatus according to claim 1, wherein the downward facing lyophilic surface has a first portion that is higher than the substrate holding surface.

6. An exposure apparatus according to claim 1, wherein the recovery device has a recessed portion that suctions the liquid by the capillary phenomenon.

7. An exposure apparatus according to claim 6, wherein at least a part of the recessed portion is lyophilic.

8. An exposure apparatus according to claim 1, wherein the member includes a surface that is substantially parallel to the substrate holding surface, and at least a part of which is liquid repellent.

9. An exposure apparatus according to claim 1, wherein at least a part of the holder is liquid repellent.

10. An exposure apparatus according to claim 1, wherein the substrate holding surface is liquid repellent.

11. An exposure apparatus according to claim 1, wherein the protruding portion includes a lyophilic radially innermost side surface that opposes the side surface of the outer circumferential part of the substrate held by the holder.

12. An exposure apparatus according to claim 11, wherein the downward facing lyophilic surface is downwardly inclined in a direction away from the substrate held on the holder.

13. An exposure apparatus according to claim 1, wherein a portion of the holder that opposes the protruding portion is liquid repellent.

14. An exposure apparatus according to claim 1, wherein:
the protruding portion includes a flat upper surface which is provided around the holder, and which is substantially flush with the upper surface of the substrate held on the holder,
wherein the recovery device recovers, using the lyophilic surface, the liquid which has leaked from a space between the flat upper surface and the upper surface of the substrate held on the holder.

15. The exposure apparatus according to claim 1, further comprising:
a liquid supply system which has a supply port, the liquid supply system supplying the liquid onto the substrate to form a liquid immersion area on a portion of the upper surface of the substrate during the exposure,
wherein the substrate is exposed through the liquid with exposure light.

16. A device manufacturing method comprising:
exposing, through the liquid, the substrate held on the holder of the stage apparatus of the exposure apparatus according to claim 1; and
processing the exposed substrate.

17. An exposure apparatus according to claim 1, wherein at least a part of the protruding portion having the downward facing lyophilic surface has a thickness that is smaller than a thickness of the substrate.

18. An exposure apparatus according to claim 1, wherein at least a part of the downward facing lyophilic surface is disposed higher than a lower surface of the substrate held on the holder.

19. An exposure method comprising:
holding a substrate on a holder, there being a member disposed in a vicinity of the holder radially outward of an outer circumferential part of the substrate held by the holder, the member including a protruding portion that protrudes radially inward toward and opposes a side surface of the outer circumferential part of the substrate held on the holder such that a gap is provided between the protruding portion and the side surface of the outer circumferential part of the substrate held by the holder, the protruding portion having a downward facing lyophilic surface that faces downward and is disposed lower than an upper surface of the substrate held by the holder;
supplying liquid to the upper surface of the substrate; and
irradiating an image of a pattern onto the upper surface of the substrate held by the holder through the liquid,
wherein the liquid in the gap flows from the gap to the downward facing lyophilic surface.

20. An exposure method according to claim 19, further comprising:
recovering part of the liquid using the lyophilic surface.

21. An exposure method according to claim 19, wherein a part of the holder is liquid repellent.

22. An exposure method according to claim 19, wherein at least a part of the protruding portion having the downward facing lyophilic surface has a thickness that is smaller than a thickness of the substrate.

23. An exposure method according to claim 19, wherein at least a part of the downward facing lyophilic surface is disposed higher than a lower surface of the substrate held on the holder.

* * * * *